United States Patent [19]

Takeuchi et al.

[11] Patent Number: 4,896,284
[45] Date of Patent: Jan. 23, 1990

[54] SEMICONDUCTOR INTEGRATED CIRCUIT FOR MULTIPLYING ANALOG AND DIGITAL VALUES

[75] Inventors: Sumitaka Takeuchi; Keisuke Okada; Masatoshi Kimura, all of Itami, Japan

[73] Assignee: Mitsubishi Denki Kabushiki Kaisha, Japan

[21] Appl. No.: 226,636

[22] Filed: Aug. 1, 1988

[30] Foreign Application Priority Data

Aug. 31, 1987 [JP] Japan .................................. 62-218508

[51] Int. Cl.$^4$ ............................. G06F 7/52; G06J 1/00
[52] U.S. Cl. ..................................... 364/606; 364/754
[58] Field of Search ............... 364/606, 729, 760, 604, 364/754, 756, 757; 341/159

[56] References Cited

U.S. PATENT DOCUMENTS

| 3,522,420 | 8/1970 | Hartmann et al. ................... 364/606 |
| 3,573,448 | 4/1971 | Valentine ............................. 364/606 |
| 4,027,147 | 5/1977 | Majos et al. ......................... 364/759 |
| 4,616,334 | 10/1986 | Vogelsong et al. ................. 364/606 |
| 4,718,031 | 1/1988 | Nukiyama ........................... 364/757 |

OTHER PUBLICATIONS

U.S. Pat. Appln. 111,047, filed 10-21-87.

Primary Examiner—John R. Lastova
Attorney, Agent, or Firm—Townsend & Townsend

[57] ABSTRACT

A semiconductor integrated circuit so arranged that selection is made out of output signals of a decision circuit which determines the levels of analog values inputted as an object for multiplication and multiplication is carried out with respect to the selected signal and the digital value inputted as an object for multiplication, the result of the multiplication being added with the digital value as shifted to the higher position of specified bits, a multiplication result being thereby calculated with respect to the analog value and the digital value, whereby the required area of wiring connections is reasonably reduced and faster operation is assured.

4 Claims, 4 Drawing Sheets

SEMICONDUCTOR INTEGRATED CIRCUIT FOR MULTIPLYING ANALOG AND DIGITAL VALUES

BACKGROUND OF THE INVENTION

1. Field of the Invention

This invention relates to semiconductor integrated circuits and, more particularly, to a semiconductor integrated circuit of the type in which A/D converters have an encoder section which outputs the result of a multiplication carried out with an analog value and a digital value using an output value of a selected decision circuit as a multiplier (or a multiplicand) and an input digital value as a multiplicand (or a multiplier).

2. Description of the Prior Art

FIG. 1 is a circuit diagram showing a conventional semiconductor integrated circuit as, for example, disclosed in U.S. patent application Ser. No. 07/111,047 of the present applicants, in which parallel comparison type A/D converters have an encoder section which outputs the result of a multiplication carried out using an output value of a decision circuit as a multiplier (or a multiplicand) and an input digital value as a multiplicand (or a multiplier).

In FIG. 1, reference numeral 1 designates a supply voltage terminal for supplying source voltage, to which are connected ladder registers 3,3 ... for dividing the supply voltage into reference voltages for comparators 4,4 ..., respective interim nodes of the ladder resistors 3,3 ... being each connected to one input terminal of corresponding one of the comparators 4, 4 .... The comparators 4, 4 ... each has another input terminal connected to an analog input terminal 2 which inputs analog values. Respective output terminals of the comparators 4,4 ... are individually connected to a decision circuit 5 which outputs "1" according to analog value. Output terminals of the decision circuit 5 are connected to an input terminal of a control circuit 7 which carries out multiplication with respect to a digital value and an analog value input as objects for multiplication and outputs binary encoded multiplication results.

Digital input terminals for inputting digital values are connected to a control signal generating circuit 6 which generates a control signal according to each digital value. A signal line which inputs control signals generated by the control signal generating circuit 6 is connected to the control circuit 7. The control circuit 7 comprises a plurality of transfer gates and a plurality of OR gates. Its output terminals output aforesaid multiplication results.

Next, the manner of operation of the conventional semiconductor integrated circuit will be explained. For the sake of simplicity, it is assumed that the analog value has "2" of the decimal notation and the digital value has "3" of the decimal notation. The supply voltage applied to the supply voltage terminal 1 is divided by the ladder resistors 3, 3 ... into reference voltages, which in turn are individually input to the comparators 4, 4 .... The comparators 4, 4 ... compare the magnitude of such reference voltage and the analog value input to the analog input terminal 2, and if, for example, the analog value is greater than the reference voltage, they output "1" (High). The decision circuit 5 determines an analog value using the output of the comparators 4, 4 ... and outputs "1" (High) according to the analog value. In this instance, the output signals $A_0, A_1$ ... of the decision circuit 5 are ($A_3=0, A_2=1, A_1=0, A_0=0$) which represent "2" of decimal notation. The digital value is illustrative of an example of 2 bits, and assuming that the higher bit thereof is $R_1$ and the lower bit is $R_0$, higher bit $R_1$, lower bit $R_0=1$ (High) because the digital value is in this example "3" of decimal notation. With respect to this digital value, the control signal generating circuit 6 generates five kinds of control signals ($R_0, R_1, R_1 R_0, R_1 \overline{R_0}, R_1+R_0$) as shown in FIG. 1, which control signals are given as gate signals of the transfer gates in the control circuit 7. In the instance of FIG. 1, control signals $R_0, R_1, R_1 R_0$ are 1 (High) with respect to the output signal $A_2=1$(High), and by the individual transfer gates being turned ON, output signals $X_0, X_1$ ... of the control circuit 7 are ($X_3=0, X_2=1, X_1=1, X_0=0$), which represent "6" of the decimal notation. This value represents "2×3", a multiplication result with respect to the analog value and the digital value, and it can be fetched as an output of the control circuit 7. Where output $A_0$ of the decision circuit 5 is 1 (High), all outputs of the control circuit 7 are 0 (Low) irrespective of the digital value, because the analog value is "0", and accordingly the multiplication result represents "0".

Conventional semiconductor integrated circuits of the type having a multiplication function employ the encoder section of a parallel comparison type A/D converter as above described. Therefore, an increase in the number of bits of analog inputs requires a greater area of wiring for output signaling by the decision circuit 5, and in addition it involves the problem that the control signal generating circuit 6 and the control circuit 7 become complicated, a greater circuit area being thus required.

SUMMARY OF THE INVENTION

This invention is intended to solve aforesaid problems and accordingly it is a first object of the invention to provide a semiconductor integrated circuit of such arrangement that selection is made of output signals of a decision circuit so that less wiring space is required for output signals of the decision circuit.

It is a second object of the invention to provide a semiconductor integrated circuit of such arrangement that the result of a multiplication carried out with respect to a selected output signal and a digital value is added with a digital value shifted to the higher position of specified bits so that the configuration of the multiplication circuit is simplified, which therefore has reduced circuit area and improved high speed multiplication functions.

The above and further objects and features of the invention will more fully be apparent from the following detailed description with accompanying drawings.

DESCRIPTION OF THE PREFERRED EMBODIMENTS

One embodiment of the invention will now be described with reference to the accompanying drawings.

Figure 2:
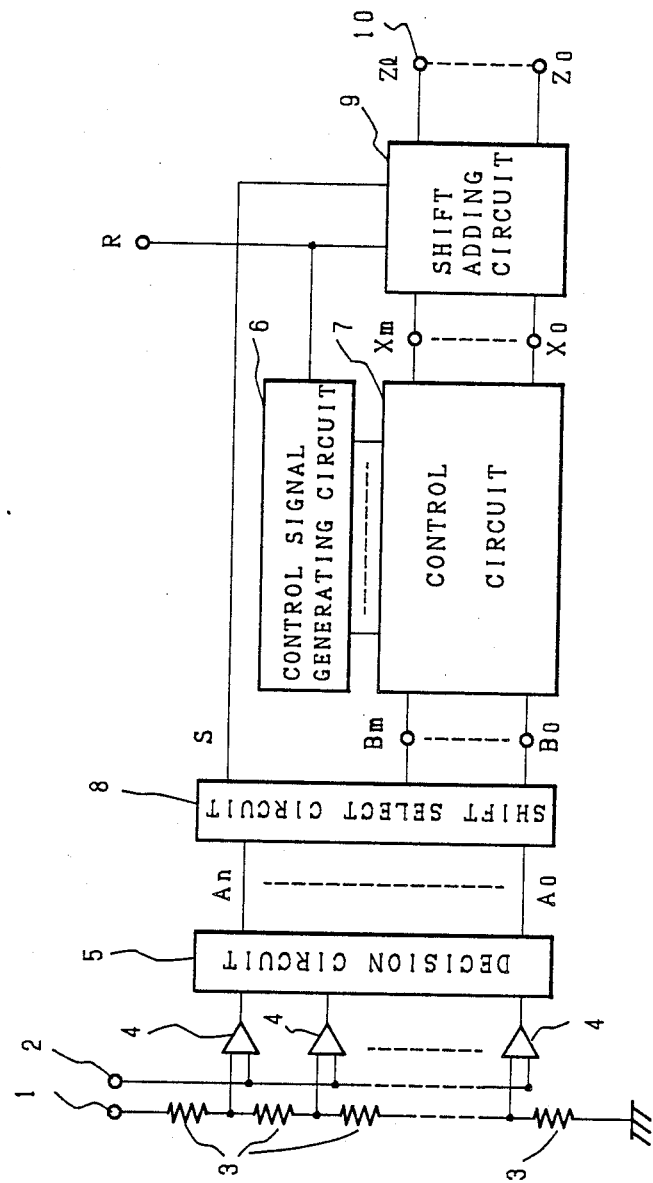
FIG. 2 is a block diagram showing a semiconductor integrated circuit arrangement according to the invention.

FIG. 2 is a block diagram showing the arrangement of the semiconductor integrated circuit according to the invention. In FIG. 2, reference numeral 1 designates a supply voltage terminal for supplying a source voltage, to which are connected ladder resistors 3, 3 . . . for dividing the supply voltage into reference voltages for comparators 4, 4 . . . , interim nodes of the ladder resisters 3, 3 . . . being each connected to one input terminal of corresponding one of the comparators 4, 4 . . . . Each of the comparators 4, 4 . . . has another input terminal, which is connected to an analog input terminal 2 which inputs analog values. Output terminals of the comparators 4, 4 . . . are individually connected to a decision circuit 5 which outputs "1" according to the analog value.

Output signals $A_0$, $A_1$, . . . $A_n$ of the decision circuit 5 are input to a shift select circuit 8 as a multiplication signal generating means which generates a shift signal and a control section input signal as a selection signal according to the number of inputs of a control circuit 7 (which circuit will be described hereinafter) from the output signals $A_0$, $A_1$ . . . $A_n$ of the decision circuit 5, and shift signal S of the shift selection circuit 8 is input to a shift addition circuit 9 which will be described hereinafter. Control section input signals $B_0$, $B_1$ . . . $B_m$ are input to the control circuit 7.

The control circuit 7 outputs the result of a multiplication carried out with respect to a digital value R input as an object for multiplication and values of aforesaid control section input signals $B_0$, $B_1$ . . . $B_m$. For this purpose, a control signal of the control signal generating circuit 6 which generates the control on the basis of the input digital value R is input to the control circuit 7. Multiplication results $X_0$, $X_1$ . . . $X_m$ output from the control circuit 7 and the digital value R are input to the shift addition circuit 9 which carried out addition of the multiplication results $X_0$, $X_1$ . . . $X_m$ and the digital value R shifted to the higher position of the specified bits in accordance with aforesaid shift signal S. Thus, outputs $Z_0$, $Z_1$ . . . $Z_l$ of the shift addition circuit 9 are multiplication results with respect to the digital value R and the analog value, which are fetched from output terminals 10, 10 . . . .

Figure 3:
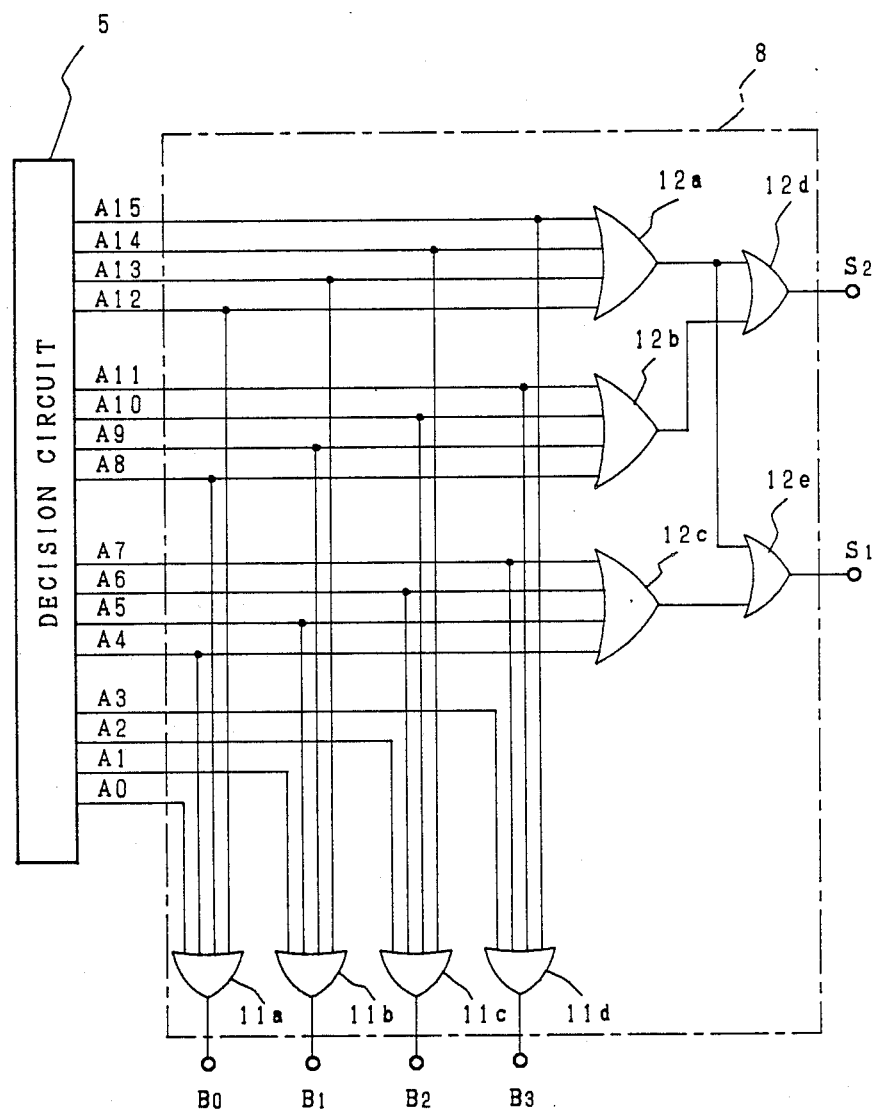
FIG. 3 is a circuit diagram showing the configuration of a shift selection circuit of the invention.

FIG. 3 is a circuit diagram showing the configuration of the shift select circuit by way of example, which illustrates the instance where the analog value is 4 bits and the control section input value based on the selection of said analog value is 2 bits. Accordingly, the number of output signals $A_0$, $A_1$ . . . $A_n$ of the decision circuit 5 is $2^4=16$ and the number of control section input signals $B_0$, $B_1$ . . . $B_m$ is $2^2=4$.

Output signals $A_0$ to $A_3$ of the control circuit 5 are individually input to 4 input 1 output type OR circuits 11a to 11d, and outputs $A_4$ to $A_7$ are individually input to OR circuits 11a to 11d and OR circuit 12c. Similarly, outputs $A_8$ to $A_{11}$, $A_{12}$ to $15$ are individually input to OR circuits 11a to 11d and OR circuits 12b, 12a. Output signals of OR circuit 12a are input to OR circuits 12d and 12e, and output signals of OR circuits 12b, 12c are individually input to OR circuits 12a, 123.

The OR circuits 11a, 11b, 11c, 11d individually output control section input signals $B_0$, $B_1$, $B_2$, $B_3$ representing selected the outputs of the decision circuit 5, OR circuits 12d, 12e individually output shift signals $S_2$, $S_1$.

In this instance, if the 4 bit analog value is "a" and if the 2 bit control section input signal value is "b", $a=(b+2^2S_1+2^3S_2)$, and in the case where the digital value is "r", the result of multiplication with respect to the analog value "a" and the digital value "r" is expressed as follow:

$$a \times r = (b+2^2S_1+2^3S_2) \times r = b \times r + 2^2S_1 \times r + 2^3S_2 \times r$$

In this expression, "b×r" represents the output of the control circuit 7. In the shift addition circuit 9, if the shift signal $S_1$ is 1 (High), 2-bit shifted digital value "$2^2 \times r$" is added, and if the shift $S_2$ is 1(High), 3-bit shifted digital value "$2^3 \times r$" is added, whereby "a×r", the result of multiplication with respect to the analog value and the digital value, can be obtained.

Figure 1:
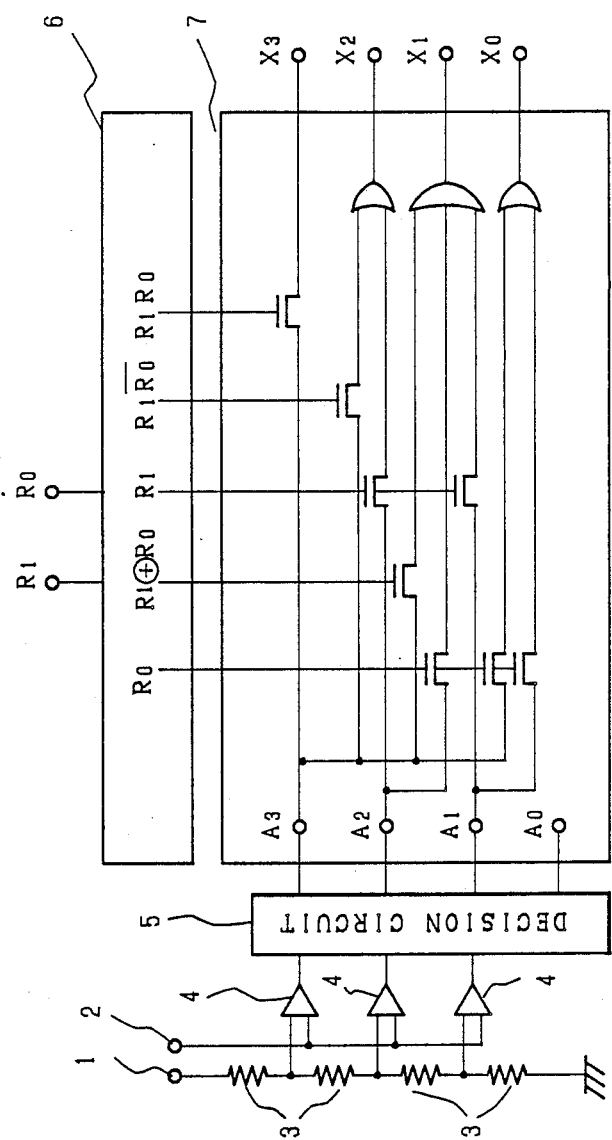
FIG. 1 is a circuit diagram showing the conventional semiconductor integrated circuit configuration.
Figure 4:
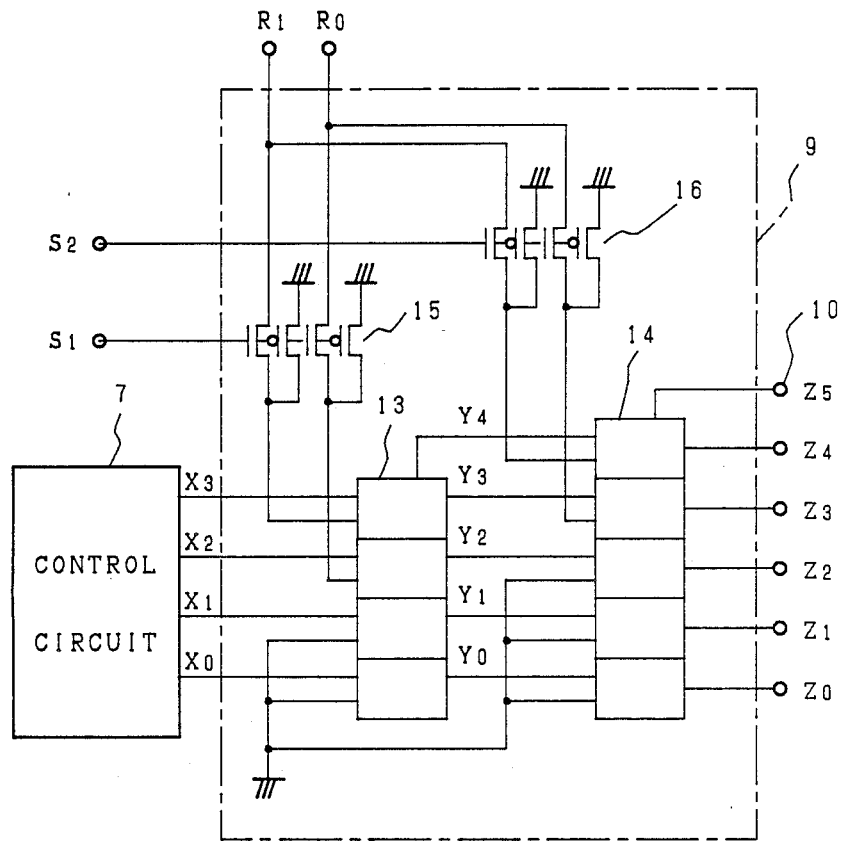
FIG. 4 is a circuit diagram showing the configuration of a shift addition circuit of the invention.

FIG. 4 shows one embodiment of the shift addition circuit 9. In FIG. 4, reference numeral 7 is the control circuit shown in FIG. 1; 13 is a first addition circuit consisting of 4 adders which carriers out addition of the output of the control circuit circuit 7 and a 2-bit shifted digital value, the output of the first addition circuit being input to a second addition circuit 14. The second addition circuit 14 consists of 5 adders and performs addition of the output of the first addition circuit 13 and a 3-bit shifted digital value. Numeral 15 is a transfer gate which transmits the digital value when the shift signal $S_1$ is High, the transmitted digital value being input to the higher 2 bits of the first addition circuit 13. Numeral 16 is a transfer gate which transmits the digital value when the shift signal $S_2$ is 1 (High), the transmitted digital value being input to the higher 2 bits of the second addition circuit. Multiplication results $Z_0$–$Z_l$ with respect to the analog value and the digital value are output to an output terminal 10.

Next, the operation of above described embodiment will be explained. For the sake of simplicity, it is assumed that the input analog value has "10" of decimal notation and the digital value has "3" of decimal notation. In FIG. 2, the operation up to the stage in which the decision circuit 5 decides the level of the analog value is the same as that in the conventional circuit. In the case of this embodiment, the output signal of decision circuit 5 as shown in FIG. 3 is $A_{10}=1$ (High), and all its output signals but $A_{10}$ are 0 (Low). As a result, the output of OR circuit 11c is 1 (High), and the control section input value is ($B_3=0$, $B_2=1$, $B_1=0$, $B_0=0$)="2". Shift signals of OR circuits 12b and 12d and 1 (High), and thus signals $S_1=0$ (Low) and $S_2=1$ (High) are output. Accordingly, the analog value is expressed as "10"=$(2+2^{2\cdot 0}+2^{3\cdot 1})=(2+2^3)$.

Operation of the control signal generating circuit 6 and of the control circuit 7 is the same as that in the conventional circuit; accordingly, where the control section input value is "2" and the digital value is "3", the digital value "3" is expressed as "11" in binary notation, the higher bit $R_1$, the lower bit $R_0$ being 1 (High). The output value of the control circuit 7 is therefore ($X_3=0$, $X_2=1$, $X_1=1$, $X_0=0$)="6", which is input to the shift addition circuit 9. In this conjunction, shift signals are $S_1=0$ (Low), $S_2=1$ (High). The output of the control circuit 7 is inputted to addition circuit 13 as shown in FIG. 4, and also, the shift signal $S_1$ being 0, the higher bits $R_1$, the lower bit $R_0=0$ of the digital value are input in 2-bit shifted terms to the first addition circuit 13 through the transfer gate 15. Thus, the output signals of the first addition circuit 13 are ($Y_4=0$, $Y_3=0$, $Y_2=1$, $Y_1=1$, $_0=0$). The output signals of the first addition circuit 13 are input to the second addition circuit 14, and also digital value $R_1$, $R_0=0$ is input thereto in 3-bit shifted terms through the transfer gate 16 because of shift signal $S_2=1$. Thus, the output signals of the second addition circuit 14 are ($Z_5=0$, $Z_4=1$, $Z_3=1$, $Z_2=1$, $Z_1=1$, $Z_0=0$), which represents "30" of decimal notation. This value represents "10×3", the result of multiplication with respect to the analog value and the digital value, which can be fetched from the output terminal 10.

As above described, in this embodiment, outputs from the decision circuit are selected and multiplication is performed with respect to the selected control section input value and the digital value. the result of the multiplication is added to the digital value as shifted to the higher place of the specified bits, whereby the multiplication result with respect to the analog value and the digital value is fetched. Therefore, even if the analog value involves a larger number of bits, the configuration of the control signal generating circuit and of the control circuit is simplified, and thus the required space of the circuit is reduced and in addition the required wiring are for outputs of the decision circuit is reduced. According to the invention, therefore, a semiconductor integrated circuit having improved its multiplication function high speed, which is of high practical value can be provided.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds thereof are therefore intended to be embraced by the claims.

What is claimed is:

1. A semiconductor integrated circuit for outputting a multiplication result with respect to an analog value and a digital value input as objects for multiplication, comprising:
   a plurality of comparators for outputting comparator output signals dependent upon the result of a comparison between the voltage corresponding to a level of the analog value and reference voltages set for each of the comparators;
   decision means for outputting a plurality of decision signals dependent upon the level of the comparator output signals;
   multiplication signal generating means for generating predetermined selection signals for multiplication on the basis of said decision signals and generating shift signals for shifting the digital value to a higher position of a set of specified bits;
   control signal generation means for generating a control signal according to the digital value;
   control means for controlling said selection signals generated by said multiplication signal generating means according to said control signal and outputting the multiplication result with respect to the digital value and said selection signals; and
   shift addition means including a transmission means for transmitting a digital value to the higher position of the set of specified bits according to said shift signal and an adding means for adding the digital value to the multiplication result.

2. A semiconductor integrated circuit as set forth in claim 1, wherein said reference voltage is a divided value output from respective interim nodes of ladder resisitors receiving a predetermined voltage at one end.

3. A semiconductor integrated circuit as set forth in claim 1, wherein said multiplication signal generating means comprises:
   selection means having a plurality of OR circuits for generating a predetermined selection signal from said plurality of decision signals, and
   shift signal generating means having a plurality of OR circuits for generating shift signals for shifting the digital value to the higher position of the specified bits.

4. A semiconductor integrated circuit as set forth in claim 1, wherein said transmission means includes a plurality of transfer gates and said addition means includes a plurality of adders.

* * * * *